United States Patent
Watanabe

(10) Patent No.: US 8,730,345 B2
(45) Date of Patent: May 20, 2014

(54) SOLID-STATE IMAGING APPARATUS, DRIVING METHOD THEREOF AND IMAGING SYSTEM

(75) Inventor: Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 617 days.

(21) Appl. No.: 12/476,487

(22) Filed: Jun. 2, 2009

(65) Prior Publication Data

US 2009/0303365 A1   Dec. 10, 2009

(30) Foreign Application Priority Data

Jun. 6, 2008 (JP) ................................ 2008-149893

(51) Int. Cl.
*H04N 5/235* (2006.01)
*H04N 5/353* (2011.01)

(52) U.S. Cl.
CPC .......... *H04N 5/2357* (2013.01); *H04N 5/3532* (2013.01)
USPC ...................... 348/226.1; 348/302; 250/208.1

(58) Field of Classification Search
CPC ............................ H04N 5/2357; H04N 5/3532
USPC ............ 348/226.1, 228.1, 241, 296, 300–301
See application file for complete search history.

(56) References Cited

U.S. PATENT DOCUMENTS

| | | | |
|---|---|---|---|
| 4,914,519 A | 4/1990 | Hashimoto et al. | 358/172 |
| 6,731,337 B2 | 5/2004 | Watanabe | 348/308 |
| 7,456,880 B2 | 11/2008 | Okita et al. | 348/243 |
| 7,514,732 B2 | 4/2009 | Okita et al. | 257/292 |
| 7,995,112 B2 * | 8/2011 | Kinoshita et al. | 348/226.1 |
| 2004/0051791 A1 * | 3/2004 | Hashimoto | 348/226.1 |
| 2005/0046704 A1 | 3/2005 | Kinoshita | 348/226.1 |
| 2005/0238259 A1 | 10/2005 | Kim et al. | 382/312 |
| 2006/0061674 A1 | 3/2006 | Iida et al. | 348/308 |
| 2006/0087573 A1 * | 4/2006 | Harada | 348/294 |
| 2007/0146501 A1 | 6/2007 | Matsuoka | |
| 2008/0029787 A1 | 2/2008 | Watanabe et al. | 257/233 |
| 2008/0029793 A1 | 2/2008 | Watanabe et al. | 257/291 |

(Continued)

FOREIGN PATENT DOCUMENTS

| | | |
|---|---|---|
| JP | 2000-059688 A | 2/2000 |
| JP | 2005-033616 A | 2/2005 |

(Continued)

OTHER PUBLICATIONS

Office Action—Japanese Patent Appln. No. 2008-149893, Japanese Patent Office, Jul. 31, 2012.

*Primary Examiner* — Zachary Wilkes
(74) *Attorney, Agent, or Firm* — Fitzpatrick, Cella, Harper & Scinto

(57) ABSTRACT

A solid-state imaging apparatus includes: a plurality of photoelectric conversion elements arranged in a matrix and converting light into electric carriers; a transfer gate for transferring the electric carriers generated by the conversion to a floating node; a first transistor for amplifying a signal based on a voltage of the floating node and for outputting the amplified signal to a column signal line; and a second transistor for resetting the voltage of the floating node, wherein the solid-state imaging apparatus includes a transfer unit for combining signals from the column signal lines, based on the voltage of the floating nodes after the reset of the floating nodes by the second transistor, wherein outputting a signal based on the combined signals from the column signal lines based on the voltage of the floating nodes, for detecting a flicker of an imaging light source.

8 Claims, 7 Drawing Sheets

(56) References Cited

U.S. PATENT DOCUMENTS

| | | | |
|---|---|---|---|
| 2008/0303930 A1 | 12/2008 | Kuroda et al. | 348/308 |
| 2009/0015699 A1 | 1/2009 | Watanabe et al. | 348/308 |
| 2009/0207292 A1 | 8/2009 | Watanabe | 348/308 |
| 2009/0256230 A1 | 10/2009 | Watanabe | 257/435 |

FOREIGN PATENT DOCUMENTS

| | | |
|---|---|---|
| JP | 2005-175986 A | 6/2005 |
| JP | 2005-277513 A | 10/2005 |
| JP | 2005-318504 A | 11/2005 |
| JP | 2007-174537 A | 7/2007 |

\* cited by examiner

SOLID-STATE IMAGING APPARATUS, DRIVING METHOD THEREOF AND IMAGING SYSTEM

BACKGROUND OF THE INVENTION

1. Field of the Invention

The present invention relates to a solid-state imaging apparatus, a driving method thereof, and an imaging system.

2. Description of the Related Art

In recent years, the progress of solid-state imaging apparatus has been popularizing inexpensive digital cameras having higher image qualities. In particular, the performance advances of complementary metal oxide semiconductor sensors (CMOS sensors), which have an active element in each of their pixels and can mount peripheral circuitry on each of their chips, have been remarkable, and the CMOS sensors have been replaced with a part of charge coupled devices (CCD sensors). If moving image photographing is performed under the illumination of a fluorescent light or the like when the moving image photographing is performed using a CMOS sensor, then temporal light-dark changes, the so-called fluorescent light flicker, are caused in a pixel signal of a photographing output by the difference between the frequency of the luminance changes of the fluorescent light and the vertical synchronizing frequency (imaging frequency) of the used camera. As described in Japanese Patent Application Laid-Open No. 2005-033616 (hereinafter referred to as Patent Document 1), light-dark changes are caused not only between fields but also within one field in the flicker phenomenon, and sometimes appear as a striped pattern on a screen. The Patent Document 1 proposes the following method in regard to this problem. The method estimates the flicker component by using the continuity of the flicker from an pixel signal from an imaging element, and corrects the pixel signal from the imaging element according to the estimation result to reduce the flicker component.

Moreover, Japanese Patent Application Laid-Open No. 2005-318504 (hereinafter referred to as Patent Document 2) proposes an example of providing a pixel region dedicated for flicker detection differently from the imaging for recording or an ornamental use. The technique disclosed in the Patent Document 2 provides a pair of pixel columns for detecting flicker noises and makes exposure times different from each other.

However, the technique disclosed in the Patent Document 1 includes the restriction of setting an exposure time in a drive mode for reducing flickers (flicker reducing drive mode), and a disadvantage of the impossibility of performing the optimization of the exposure time according to the illuminance of a subject. For example, when photographing of 60 fps is being performed, the maximum exposure time is a value shorter than 1/60 second slightly since one frame is 1/60 second and there is a dead time for readout to be considered. The options of the exposure times are limited to 2/100, 1/100, and 1/120 seconds by the technique mentioned above. A system for entering the flicker reducing drive mode by the technique mentioned above when a flicker component of a light source is detected is tried to be considered. In this case, after the system has entered the flicker reducing drive mode once, the existence or inexistence of the flicker cannot be detected, and the system cannot be escaped from the flicker reducing drive mode even if the flicker component of the light source is eliminated again. Consequently, the reduction of the dynamic range of the system and the deterioration of the signal-to-noise (S/N) ratio of a low illuminance image are caused by the existence of the restriction in the degree of freedom of setting accumulation times. The problem mentioned above is caused by the performance of the detection of a flicker based on the imaged image for recording or the like itself.

Moreover, since the technique proposed by the Patent Document 2 provides the pixel columns unnecessary for imaging and must perform dependent readout processing, the proposed technique increases the cost of the camera and has the adverse effect to the miniaturization of the camera owing to the increase of the chip size thereof. Moreover, since the photographing region in which flicker detection is performed is restricted to a part of the screen, such as the end thereof, it is difficult to heighten the accuracy of detecting a flicker in distinction from a pattern at the time of photographing a moving subject.

SUMMARY OF THE INVENTION

The present invention is directed to provide a solid-state imaging apparatus capable of performing ideal flicker detection with a simple configuration, a driving method thereof, and an imaging system.

A solid-state imaging apparatus of the present invention comprises: a plurality of photoelectric conversion elements arranged in a matrix and converting light into electric carriers; a transfer gate for transferring the electric carriers generated by the conversion to a floating node; a first transistor for amplifying a signal based on a voltage of the floating node and for outputting the amplified signal to a column signal line; and a second transistor for resetting the voltage of the floating node, wherein the solid-state imaging apparatus comprises a transfer unit for combining signals from the column signal lines, based on the voltage of the floating nodes after the reset of the floating nodes by the second transistor, and for outputting a signal based on the combined signals from the column signal lines based on the voltage of the floating nodes, to detect a flicker of an imaging light source.

A driving method of a solid-state imaging apparatus of the present invention comprises, wherein the solid-state imaging apparatus comprises: a plurality of photoelectric conversion elements arranged in a matrix and converting light into electric carriers; a transfer gate for transferring the electric carriers generated by the conversion to a floating node; a first transistor for amplifying a signal based on a voltage of the floating node and for outputting the amplified signal to a column signal line; and a second transistor for resetting the voltage of the floating node, wherein the driving method comprises: a step of combining signals from the column signal lines based on the voltage of the floating nodes after the reset of the floating nodes by the second transistor, and a step of detecting a flicker of an imaging light source based on the signal derived by the combining step.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE EMBODIMENTS (First Embodiment)

Figure 1:
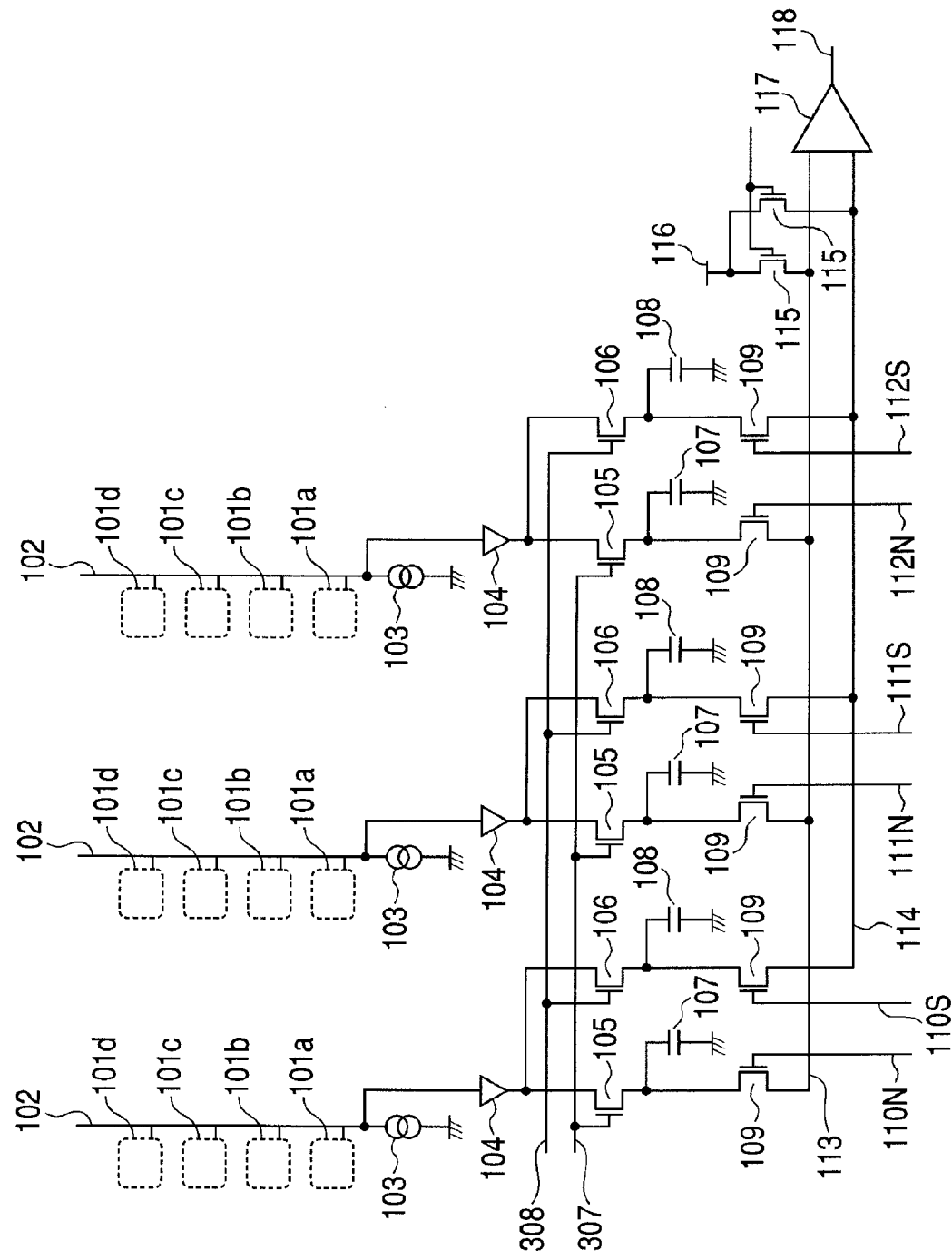
FIG. 1 is an explanatory diagram of a solid-state imaging apparatus according to a first embodiment of the present invention.

FIG. 1 is a schematic diagram of a solid-state imaging apparatus according to a first embodiment of the present invention. The solid-state imaging apparatus includes pixels 101a to 101d, each including a photoelectric conversion element and a circuit for reading out a signal based on electric carriers generated by the photoelectric conversion element. The pixels 101a to 101d are two-dimensionally arranged in a matrix.

The solid-state imaging apparatus includes vertical signal lines (first signal lines) 102, through which signals from the pixels 101a to 101d are output. The solid-state imaging apparatus further includes constant current circuits 103 and transistors (not illustrated), and the constant current circuit 103 and the transistor in each of the pixels 101a to 101d constitute a source follower circuit to perform the amplification (impedance conversion) of a signal according to the quantity of the light entering each photoelectric conversion element. The solid-state imaging apparatus further includes column amplifiers 104, each provided to each pixel column or every plurality of pixel columns.

The solid-state imaging apparatus further includes line memories 107 and 108 for holding the signals from the column amplifiers 104. The signals from the column amplifiers 104 are held by the line memories 107 and 108 through switches 105 and 106, respectively.

The solid-state imaging apparatus further includes horizontal output lines (second signal lines) 113 and 114. The signals stored in the line memories 107 and 108 are transferred to the horizontal output lines (second signal lines) 113 and 114, respectively, through switches 109.

The solid-state imaging apparatus further includes pulse supply wires 110S, 111S, and 112S and 110N, 111N, and 112N, through which pulses for controlling the conduction of the respective switches 109 are supplied by a not illustrated horizontal scanning circuit.

The solid-state imaging apparatus further includes reset switches 115. A voltage from a reset power source 116 is supplied to the reset switches 115, and the horizontal output lines 113 and 114 are reset by making the reset switches 115 be in conduction.

The solid-state imaging apparatus further includes an output amplifier 117. The signals on the horizontal output lines 113 and 114 are severally supplied to the input portion of the output amplifier 117. The output amplifier 117 performs the differential processing of the signals on the horizontal output lines 113 and 114.

The output amplifier 117 includes an output terminal 118. The output terminal 118 is drawn out onto an output pad, and the signal from the output amplifier 117 is output to an analog front end (AFE) or the like on the next stage. Alternatively, the AFE may be formed on a chip within the solid-state imaging apparatus. The AFE indicates an analog circuit portion preceding analog-to-digital (A/D) conversion. Moreover, the output amplifier 117 may also be formed as a fully differential amplifier. That is, the output amplifier 117 may be formed in a two-input and two-output form.

Figure 2:
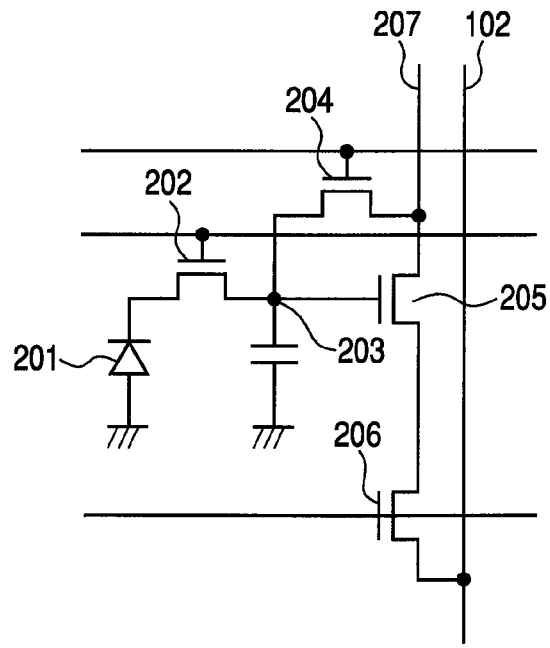
FIG. 2 is an explanatory diagram of a pixel of the first embodiment of the present invention.

FIG. 2 is an equivalent circuit diagram of each of the pixels 101a to 101d illustrated in FIG. 1. The pixel includes a photoelectric conversion element 201, made of a photodiode or the like, for converting light into electric carriers, a transfer gate 202, made of, e.g., a MOS transistor, for transferring a signal of the photoelectric conversion element 201, and a floating node 203 capable of putting the voltage thereat in a floating state when electric carriers from the photoelectric conversion element 201 are transferred. The floating node 203 can be configured to include a semiconductor region formed in, for example, a semiconductor substrate.

The pixel further includes a reset transistor 204 for setting the voltage of the floating node 203 to a reference voltage.

The pixel further includes an amplifying transistor 205 having the gate connected to the floating node 203 and being capable of functioning as an input MOS transistor of the source follower circuit.

The pixel further includes a selection transistor 206 for selecting the signal of the pixel to read out the selected signal. By providing a control wire of the selection transistor 206 to each pixel row, the selection operation of each pixel row can be performed.

The pixel further includes a wire 207 for supplying a power source voltage. Although the wire 207 supplies the power source voltage to the reset transistor 204 and the amplifying transistor 205 here, it is also possible to provide a wire to each of the reset transistor 204 and the amplifying transistor 205 individually.

The vertical signal line 102 described with regard to FIG. 1 can function as the output node of the source follower circuit mentioned above. Although it is not illustrated in FIG. 2, one of the constant current circuits 103 described with regard to FIG. 1 is connected to the vertical signal line 102, and the constant current circuit 103 constitutes a part of the source follower circuit together with the amplifying transistor 205.

It is possible to share specific elements among the elements described above, for example, the floating node 203, the amplifying transistor 205, the selection transistor 206, and the reset transistor 204, by a plurality of photoelectric conversion elements 201. Moreover, it is also possible to adopt the configuration of reading out a signal by controlling the voltage of the gate of the amplifying transistor 205 in place of using the selection transistor 206.

Figure 3:
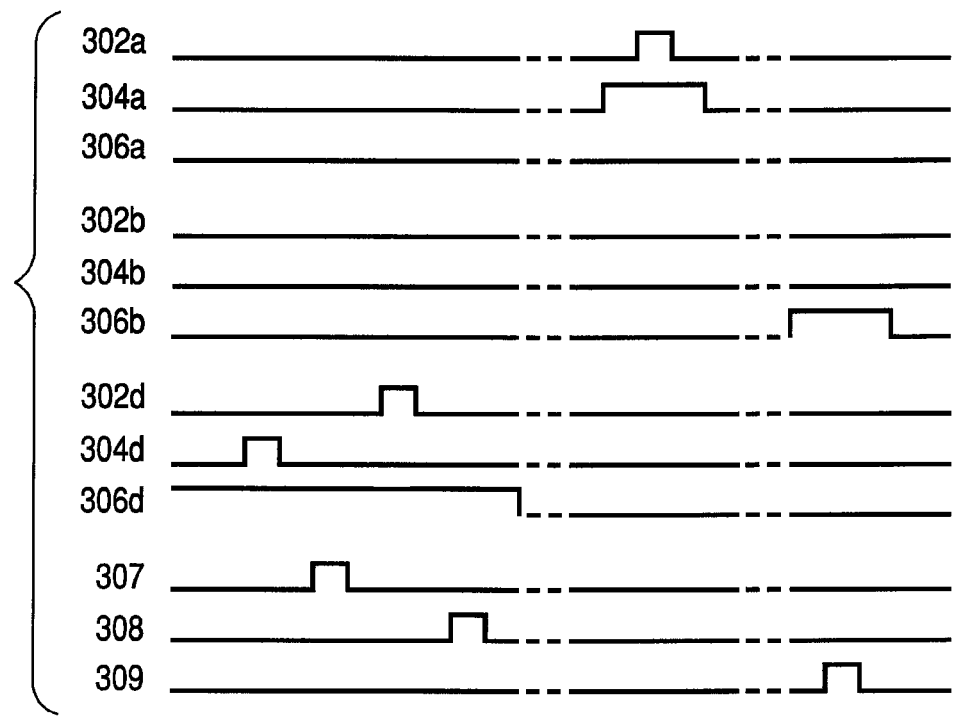
FIG. 3 is an operation explanatory diagram of the first embodiment of the present invention.

FIG. 3 is a schematic diagram of the drive pulses of the solid-state imaging apparatus of the first embodiment. Pulses 302a, 302b, . . . and 302d are applied to the transfer gates 202 of the pixels 101a, 101b, . . . and 101d, respectively. Pulses 304a, 304b, . . . and 304d are applied to the gates of the reset transistors 204 of the pixels 101a, 101b, . . . and 101d, respectively. Pulses 306a, 306b, . . . and 306d are applied to the gates of the selection transistors 206 of the pixels 101a, 101b, . . . and 101d, respectively.

Moreover, a pulse 307 is the one to be applied to the switches 105 and means the pulse for sampling and holding a noise signal at the time of performing a correlated double sampling operation to a signal from a pixel. Then, a pulse 308 is the one to be applied to the switches 106 and means the pulse for sampling and holding a light signal of the correlated double sampling operation. As the noise signal, each of the offset signals of the column amplifiers 104 corresponds to the noise signal. If the column amplifiers 104 are not provided, a noise signal of each of the pixels 101a to 101d corresponds to the noise signal. If the column amplifiers 104 are provided, the noise signal of each of the pixels 101a to 101d can be reduced by each of the column amplifiers 104 or a clamp circuit at the preceding stage of each of the column amplifiers 104.

A pulse 309 is the one for performing sampling and holding a signal for detecting a flicker. The pulse 309 is concretely applied to the switches 106 at the time of reading out a flicker detection row to be described below. Moreover, all of the switches 105, 106, 109, and 115 are made to be conducting states by a high level pulse.

In a screen scrolls the drive system of this timing diagram a row (hereinafter referred to as front curtain row) in which the photoelectric conversion elements 201 are reset and the accumulation of electric carriers is started and a row (hereinafter referred to as rear curtain row) in which the transfer gates 202 are made to conduct and the electric carriers are read out to the floating nodes 203. Then, the drive system controls the accumulation time on the basis of the time difference between the time when the front curtain row passes and the rear curtain row passes.

The pixel row including the pixels 101a is the front curtain row, in which the reset of the photoelectric conversion elements 201 and floating nodes 203 is performed. The pixel row including the pixels 101b is a flicker detection row, in which signals for detecting flickers are read out. The pixel row including the pixels 101d is the rear curtain row, in which the light signals in the photoelectric conversion elements 201 are read out.

As a drive in a frame period, the front curtain row, the flicker detection row, and the rear curtain row sequentially scroll within the array of the pixels 101a to 101d into the vertical direction.

A concrete operation and driving method of the solid-state imaging apparatus are described with reference to FIGS. 2 and 3. The floating nodes 203 and the photoelectric conversion elements 201 in the front curtain row are reset by a change of the pulses 302a and 304a to the high level.

In the flicker detection row, the electric carriers of the photoelectric conversion elements 201 are not transferred, and the signals based on the voltages of the floating nodes 203 are read out to the vertical signal lines 102 by a change of the pulse 306b to the high level. In this pixel row, the photoelectric conversion elements 201 and the floating nodes 203 were reset as a front curtain row at a certain past time in case of going back in time. Consequently, a period of from the passing of the front curtain row to the performance of the sampling and holding of signals by the pulse 309 becomes the accumulation period for the flicker detection. That is, the sensitivity components detected at the floating nodes 203 in this accumulation time are detected as the signals for detecting the flickers. As described above, each of the floating nodes 203 can be configured by using a semiconductor region. The semiconductor region is shielded from light by a wiring layer or the like lest the light should enter the semiconductor region, but it is known that the semiconductor region has slight sensitivity by the influences of the light entering the semiconductor region directly through the gaps of the shielded regions and the diffusion of the electric carriers in the semiconductor substrate. Although the sensitivity of the floating nodes 203 is remarkably lower than those of the photoelectric conversion elements 201, each of the floating nodes 203 can detect a signal almost in proportion to that of each of the photoelectric conversion elements 201 in the neighborhood of the floating node 203. That is, it is possible to perform the detection of the signals for detecting the flickers generated by the two-dimensional arrangement of the floating nodes 203 in almost the same region as the imaging region configured of the two-dimensional arrangement of the photoelectric conversion elements 201. Moreover, even if the sensitivity of the individual floating node 203 is low, it is enough for the purpose of detecting the flicker components of a light source to output an integrated value of the signals for detecting the flickers in the horizontal direction of a screen, as described below.

The important thing in this operation is to leave the electric carriers accumulated in the photoelectric conversion elements 201 held in the photoelectric conversion elements 201 at the time of reading out the signals based on the voltages at the floating nodes 203. Consequently, the accumulation period for detecting the signals for detecting the flickers and the accumulation period for imaging can be independently controlled. As for the electric carriers accumulated in the photoelectric conversion elements 201, the floating nodes 203 in the rear curtain row are first reset by the pulse 304d. After that, reset noises are read out by the pulse 307 for sampling and holding the noise signals. Then, after transferring the electric carriers in the photoelectric conversion elements 201 by the transfer pulse 302d, light signals are read out by the light signal sampling and holding pulse 308. Thereby, the correlated double sampling is made to be possible.

Figure 4:
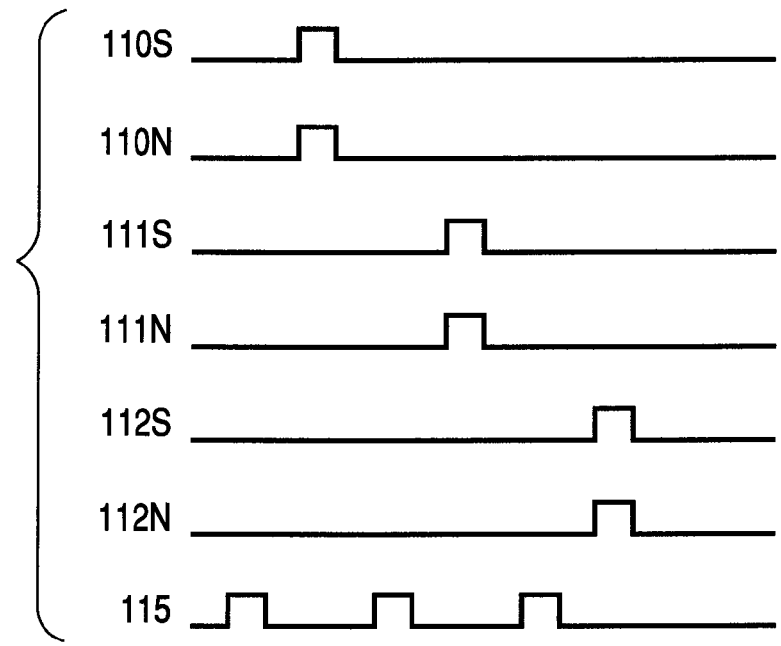
FIG. 4 is a timing diagram of imaging of the first embodiment of the present invention.

By the driving method described above, the noise signals, the light signals, and the signals for detecting the flickers can be sampled and held in the line memories 107 and 108. Furthermore, the method of outputting these signals is described with reference to FIGS. 1 and 4. Noise signals and light signals are held in the line memories 107 and 108, respectively, at the time of the outputting of the rear curtain row. The horizontal scanning of the line memories 107 and 108 are performed as follows. The pulse supply wires 110S and 110N, 111S and 111N, 112S and 112N . . . are sequentially turned on by the outputs from the horizontal scanning circuit, and thereby the signals held in the line memories 107 and 108 are sequentially transferred to the horizontal output lines 113 and 114, respectively. The signals transferred to the horizontal output lines 113 and 114 are input into the output amplifier 117, and the difference between the signals are output from the output amplifier 117. At the time of horizontal scanning, the output channel reset switches 115 are turned on every bit, and thereby the horizontal output lines 113 and 114 are reset. By performing such an operation, the differences between the noise signals and the light signals held in the line memories 107 and 108, respectively, can be output from the output terminal 118. The difference signals are the pixel signals from which noises are eliminated.

Figure 5:
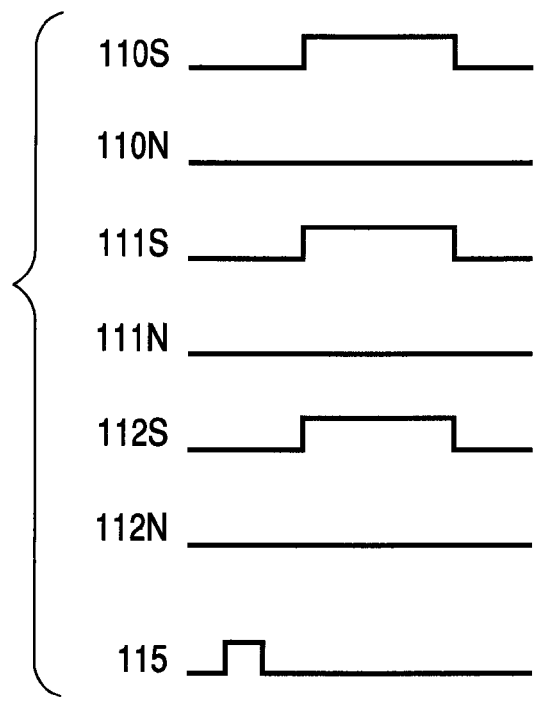
FIG. 5 is a timing diagram of flicker detection of the first embodiment of the present invention.

On the other hand, at the time of outputting the signals in the flicker detection row, as illustrated in FIG. 5, the transfer of the noise signals in the line memories 107 is not performed, and the reset voltage of the reset power source 116 is written in the horizontal output line 113. The signals held in the line memories 108 in the respective columns are transferred to the horizontal output line 114 by operating the pulse supply wires 110S, 111S, and 112S so as to take the high level simultaneously at least in a part of the periods, and the transferred signals are combined. By the operation mentioned above, the integrated value (combined value) of the signals at the floating nodes 203 in the flicker detection row can be output to the output terminal 118 as the signal for detecting the flicker of the imaging light source. Since the readout of the flicker detection row does not need a horizontal scanning time in this operation, the signal for detecting the flicker can be read out without exerting almost any influences on the speeding up of the frame rate. Furthermore, in the present embodiment, no output amplifiers and output pads (PADs) dedicated for the signal for detecting the flicker are needed to be provided, and consequently the enlargement of a chip size and an increase in cost for providing the flicker detection function can be suppressed.

According to the present embodiment, the position (time) in which the flicker detection row is inserted can be determined independently of the front curtain row and the rear curtain row, and consequently the accumulation period for flicker detection can be set independently of the accumulation periods of the photoelectric conversion elements 201. Thereby, even in the photographing mode in which flickers are hard to be generated in imaging for recording or an ornamental use, the existence or inexistence of the flickers of a light source can be detected, and consequently the determination of escaping from the flicker reducing drive mode to return to the normal drive mode can be performed in a system.

(Second Embodiment)

Figure 6:
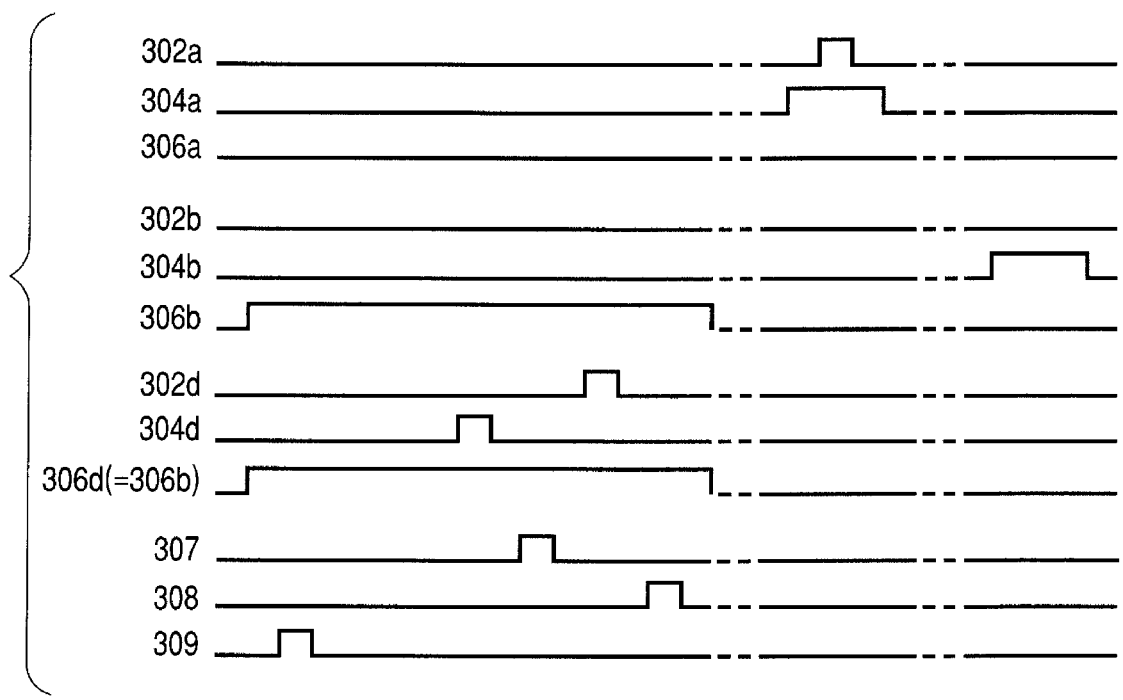
FIG. 6 is a timing diagram of a second embodiment of the present invention.

FIG. 6 is a timing diagram for illustrating a solid-state imaging apparatus according to a second embodiment of the present invention. In this embodiment, the operation illustrated in FIG. 3 of the first embodiment is replaced with the operation illustrated in FIG. 6. The components having the same functions as those of the first embodiment are denoted by the same reference numerals, and their detailed descriptions are omitted. In the present embodiment, the flicker detection row and the rear curtain row are situated in the spatially same row in the imaging region. That is, after the readout of the voltages at the floating nodes 203 as the signals for detecting the flickers by the high level of the pulse 306b, the read-out voltages are output at the timing illustrated in FIG. 5. After that, the floating nodes 203 in the same row are reset, and the readouts of the noise signals and the light signals are performed. After the readouts, imaging signals are sequentially read out at the timings illustrated in FIG. 4 by horizontal scanning.

In the present embodiment, the accumulation period for flicker detection is the one from the time of resetting the floating nodes 203 by the high level of the pulse 304b to the time of performing the readout of the charged electric carriers by the high level of the pulse 309. Since the time of resetting the floating nodes 203 by the high level of the pulse 304b can be arbitrarily selected, the accumulation period for flicker detection can be controlled independently of the front curtain row and rear curtain row of imaging.

The present embodiment has an advantage of continuously outputting flicker detection signals and imaging signals in the rows situated at the spatially same positions in an image in addition to the advantages obtained in the first embodiment. The flicker components slightly remaining even at the time of photographing in a flicker reducing mode can be further corrected in real time by using this advantage.

(Third Embodiment)

Figure 7:
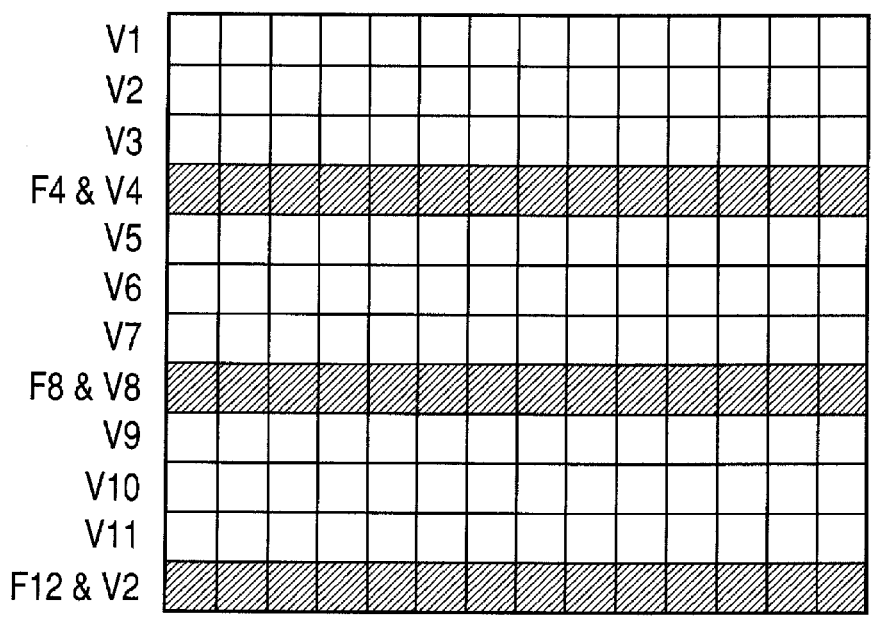
FIG. 7 is an explanatory diagram of a third embodiment of the present invention.

FIG. 7 is an explanatory diagram of a solid-state imaging apparatus according to a third embodiment of the present invention, and illustrates a two-dimensional arrangement of a pixel array. The vertical scanning of any of the front curtain row, the rear curtain row, and the flicker detection row is performed from the top to the bottom. In this embodiment, the readouts of the rear curtain rows are sequentially performed in all rows as illustrated by rows V1, V2, V3, V4, ... to output pixel signals. On the other hand, as for the flicker detection rows, it is not always necessary to read out all rows. Accordingly, in the present embodiment, the outputting of the signals for detecting the flickers is performed only from every four rows (hatched rows in FIG. 7). The signals for detecting the flickers are denoted by the referential marks F4, F8, and F12 in the figure.

Figure 8:
FIG. 8 is a timing diagram of a signal output of the third embodiment of the present invention.

Imaging signals and the singles for detecting the flickers can be output from the same output path. The timing for signal outputting of the present embodiment is illustrated in FIG. 8, the signals for detecting the flickers (F4, F8, and F12) are output every four rows among the rows (V1, V2, V3, V4, ... ) of the horizontal scanning of signal outputs of the imaging signals (signals of rear curtain). According to the present embodiment, the signals for detecting the flickers are thinned out to be output, and consequently the speeding-up of the frame rate can be realized.

(Fourth Embodiment)

Figure 9:
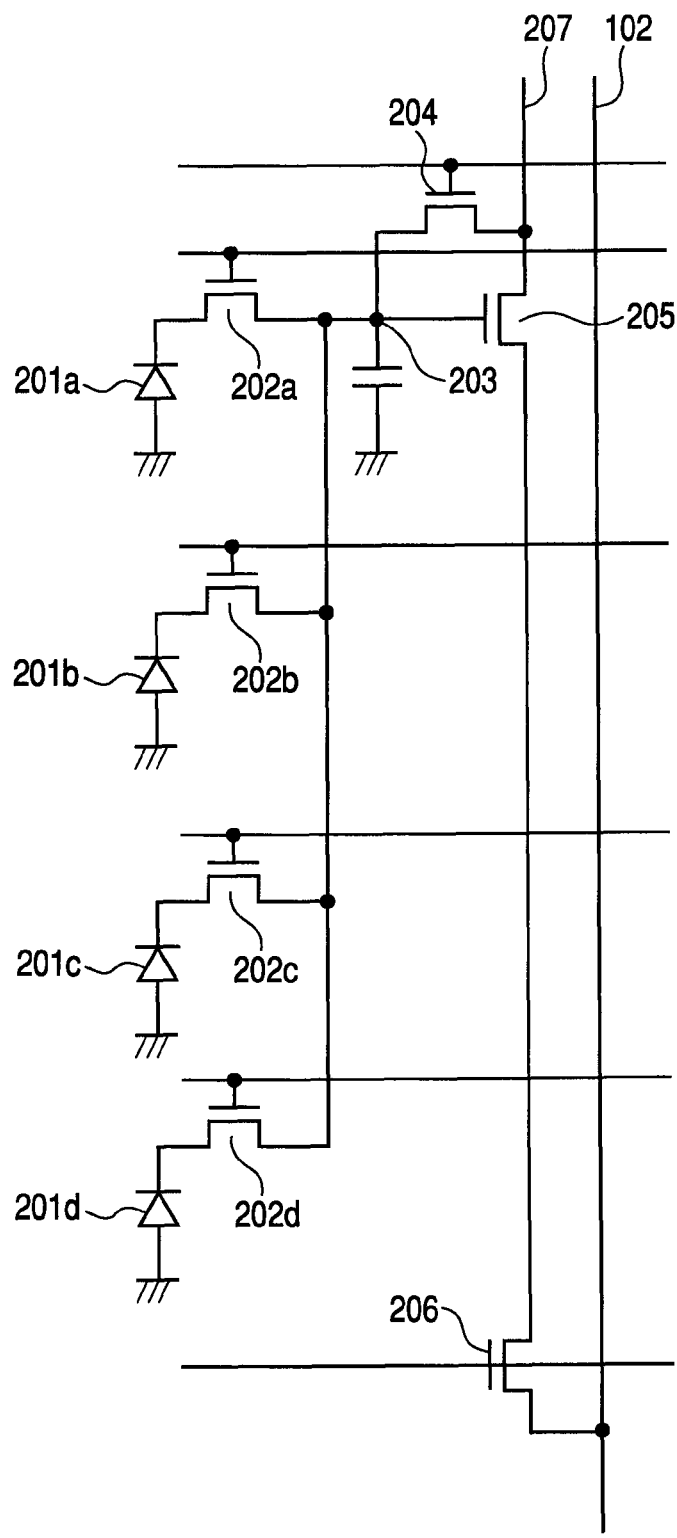
FIG. 9 is a circuit diagram of pixels in a fourth embodiment of the present invention.

The pixel circuit described with regard to the first embodiment with reference to FIG. 2 can share a readout circuit with a plurality of pixels. FIG. 9 is a circuit diagram of pixels of a fourth embodiment of the present invention. The components having the same functions as those of the first embodiment are denoted by the same reference numerals as those of the first embodiment, and their detailed descriptions are omitted. The reference numerals of the photoelectric conversion elements and transfer gates that share a readout circuit are expressed by adding letters a, b, c, and d to each row as suffixes.

In the pixels of the present embodiment, only one floating node 203 capable of accumulating singles for detecting the flickers is provided to four photoelectric conversion elements 201a to 201d performing accumulation for imaging. Consequently, a thinned-out number of signals for detecting the flickers can be output to imaging signals similarly to the third embodiment. Moreover, as the method of driving the pixels according to the present embodiment, similarly to the first embodiment and the second embodiment, it is possible to perform the reading of pixels by independently controlling the accumulation periods of the photoelectric conversion elements 201a to 201d and the floating node 203.

As a peculiar advantage of the present embodiment, since the floating node 203 is formed to extend over the region of a plurality of pixels, the sensitivity of the floating node 203 becomes large. Consequently, the sensitivity of flicker detection is improved. Furthermore, since the accumulation period of the signals for detecting the flickers can be set to a short time, the present embodiment has the advantages that the flicker detection having a high time resolution is enabled, and that the information of the frequency, phase, and the like of a flicker can be easily extracted.

(Fifth Embodiment)

Figure 10:
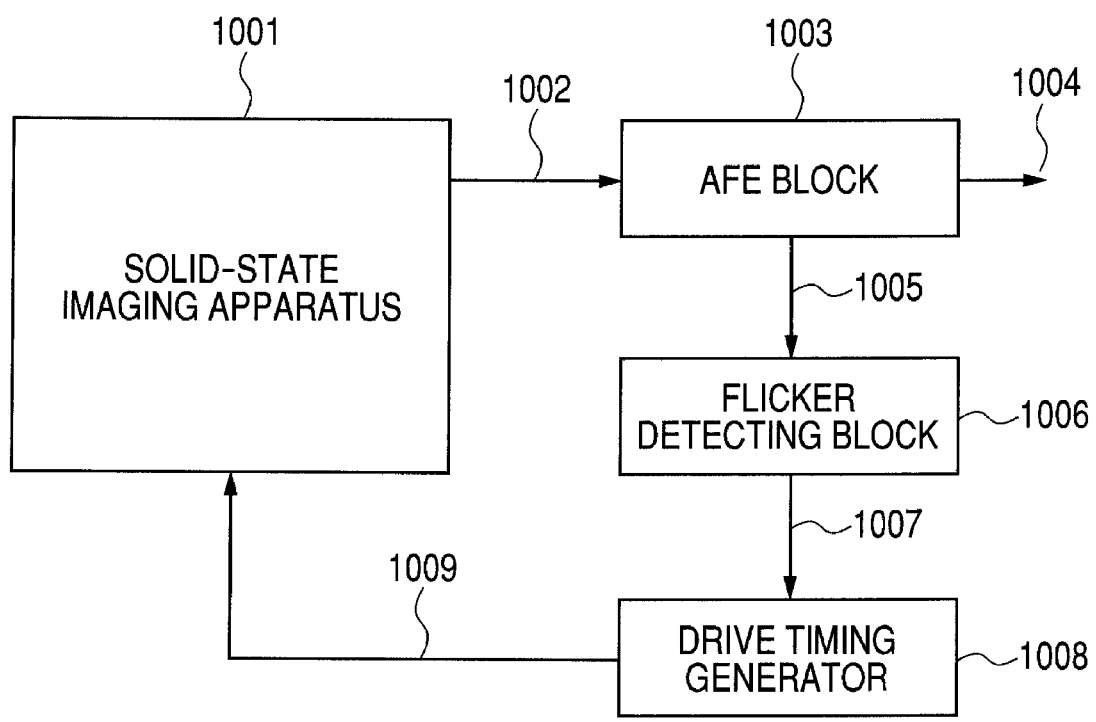
FIG. 10 is a block diagram of a moving image imaging system according to a fifth embodiment of the present invention.

FIG. 10 is a block diagram of a moving image imaging system according to a fifth embodiment of the present invention. In FIG. 10, an imaging signal and a signal for detecting the flicker 1002 are output in a time series from the output portion of a solid-state imaging apparatus 1001. The signals 1002 are input into an AFE block 1003 to be separated into an imaging signal (pixel signal) 1004 and a signal for detecting the flicker 1005. The imaging signal 1004 is transmitted to the next block as an imaging signal for recording or an ornamental use. The signal for detecting the flicker 1005 is used for determining the existence or inexistence of a flicker in a flicker detecting block 1006, and a flicker existence or inexistence determination value 1007 is transmitted to a drive timing generator 1008. The drive timing generator 1008 controls a drive pulse 1009 according to the existence or inexistence of a flicker, and the drive pulse 1009 is input into the solid-state imaging apparatus 1001. As a feature of the present embodiment, this processing loop is also working during the driving of the solid-state imaging apparatus 1001 in the flicker reducing drive mode. Even in the driving in the flicker reducing drive mode, if the flicker of the light source becomes equal to or less than a certain level, the present embodiment detects the small amount of the flicker components of the light source, and can escape from the flicker reducing drive mode to return to the normal drive mode (that is, a drive mode in which the restriction of the accumulation time is removed).

Incidentally, the moving image imaging system described with regard to the present embodiment can be configured by the use of the solid-state imaging apparatus and driving methods described with regard to the first to fourth embodiments.

Moreover, the advantages of the present invention are not limited to those of the present embodiment, but also the AFE block 1003 may be formed on the chip of the solid-state imaging apparatus 1001, and the AFE block 1003 can also include the processing described as the next stage 1004.

As described above, in the first to fifth embodiments, the obtainment of the optimum information for detecting the flickers of a light source is to satisfy the following necessary conditions. A first point is first to be capable of setting an accumulation time for obtaining a signal for detecting a flicker independently of an accumulation time (exposure time) for imaging for recording or an ornamental use. Next, a second point is to be capable of obtaining not the signal in a specific imaging region, such as the end of an image, but obtaining the light quantity in a wide range of imaging or over the whole imaging region. If these necessary conditions can be realized, the detection of a flicker of a light source can be performed independent of the existence or inexistence of a flicker in imaging, the pattern of a subject, and the movement of the subject.

In order to detect the flickers at the time of moving image photographing, the sensitivity of the floating nodes 203 is utilized. By controlling the accumulation periods of the photoelectric conversion elements 201 or 201a to 201d independently of the accumulation periods of the floating nodes 203, the flickers in an imaging light source can be detected even when photographing is performed in the flicker reducing drive mode in recording imaging. When the flicker components of the imaging light source are eliminated, it is thereby possible to escape from the flicker reducing drive mode to return to the normal drive mode.

The photoelectric conversion elements 201 or 201a to 201d are arranged in a matrix to convert light into electric carriers. The transfer gates 202 or 202a to 202d are transistors for transferring the converted electric carriers to the floating nodes 203. The amplifying transistors (first transistors) 205 amplify signals based on the voltages of the floating nodes 203 to output the amplified voltages to the signal line 102 in each column. The reset transistors (second transistors) 204 are transistors for resetting the voltages at the floating nodes 203. A transfer unit (horizontal transfer circuit) includes the switches 109, the reset switches 115, and the differential output amplifier 117. The transfer unit resets the floating nodes 203 by the reset transistors 204, following which the transfer unit combines the signals based on the voltages of the floating nodes 203 on the signal lines 102 in the respective columns. That is, in FIG. 5, by changing the signal levels on the wires 110S, 111S, and 112S to the high level at the same time, the signals in the line memories 108 are combined with one another on the horizontal output line 114.

The transfer unit outputs the signals for detecting the flickers of the imaging light source by combining the signals on the signal lines 102, based on the voltages of the floating nodes 203, in the respective columns.

It is supposed here that the signals on the signal lines 102 based on the electric carriers at the floating nodes 203 transferred by the transfer gates 202 and the like, are called as first signals, and that the signals on the signal lines 102 based on the signals at the floating nodes 203 reset by the reset transistors 204 are called as second signals. The transfer unit outputs the difference signals between the first signals and the second signals in each column as pixel signals.

At the floating nodes 203, the signals for detecting the flickers of an imaging light source are generated by light entering from the imaging light source to the semiconductor region or by the diffusion of the electric carriers in the semiconductor substrate.

In the third embodiment, the transfer unit outputs the pixel signals from all rows (rear curtain rows), and outputs the signals for detecting the flickers of the imaging light source from a part of rows (flicker detection rows).

The imaging system of the fifth embodiment includes the solid-state imaging apparatus 1001 of the first to fourth embodiments. The AFE block 1003 receives the inputs of the pixel signal and the signal for detecting the flicker of the imaging light source output by the solid-state imaging apparatus 1001 through the same path in the solid-state imaging apparatus 1001 in a time series, and outputs the pixel signal 1004 and the signal for detecting the flicker 1005 of the imaging light source into different paths. The flicker detecting block 1006 outputs the existence or inexistence determination value 1007 of the flickers of the imaging light source on the basis of the signal for detecting the flicker 1005 of the imaging light source output from the AFE block 1003. The timing generator 1008 outputs the drive pulse 1009 of the flicker reducing drive mode or the normal drive mode to the solid-state imaging apparatus 1001 according to the determination value 1007.

As described above, according to the first to fifth embodiments, the signal of combining the signals on the signal lines of the respective columns can be utilized as the signal for detecting the flicker. Since the existence or inexistence of the flickers of an imaging light source can be detected on the basis of the signal for detecting the flicker, the solid-state imaging apparatus can be controlled in the flicker reducing drive mode or the normal drive mode according to the existence or inexistence of flickers with a simple configuration.

Incidentally, any of the embodiments described above is only the examples for implementing the present invention, and accordingly these embodiments must not be the basis of limitative interpretation of the technical scope of the present invention. That is, the present invention can be implemented in various forms without departing from the technical ideas and the principal features thereof.

This application claims the benefit of Japanese Patent Application No. 2008-149893, filed Jun. 6, 2008, which is hereby incorporated by reference herein its entirety.

What is claimed is:

1. A driving method of a solid-state imaging apparatus including a plurality of pixels arranged in a matrix, each pixel including a photoelectric conversion element for converting light into electric carriers, a transfer gate for transferring the electric carriers to a floating node, a first transistor for amplifying a signal based on a voltage of the floating node and for outputting the amplified signal to a respective column signal line, and a second transistor for resetting the voltage of the floating node, the driving method comprising steps of:

reading out an image signal from the pixels in the matrix, during a frame period, by sequentially scrolling through, within the pixels in the matrix, a front curtain row, in which the photoelectric conversion elements and the floating nodes are reset, a flicker detection row, in which signals for detecting flickers are read out, and a rear curtain row, in which light signals in the photoelectric conversion elements are read out;

combining signals from the column signal lines based on the voltage of the floating node extending over regions of the plurality of pixels, during a period of maintaining the transfer gates at a non-conductive state, after resetting of the voltage of the floating nodes by the second transistors; and outputting a signal based on the combined signals from the column signal lines, for detecting a flicker of an imaging light source.

2. The driving method according to claim 1, the method further comprising a step of:

outputting as a pixel signal, column by column, a difference signal representing a difference between a signal of the column signal lines based on the electric carriers of the floating nodes transferred by the transfer gates and a signal of the column signal lines based on a signal of the floating nodes after resetting of the voltage of the floating nodes by the second transistors.

3. The driving method according to claim 1, the method further comprising a step of:

generating a signal for detecting the flicker of the imaging light source based on light incident in a semiconductor region from the imaging light source, or based on electric-carrier diffusion within a semiconductor substrate.

4. The driving method according to claim 3, the method further comprising a step of:

outputting a pixel signal for each row of pixels, and the signal for detecting the flicker of the imaging light source for a part of the rows of the pixels.

5. A driving method of an imaging system including a solid-state imaging apparatus, which includes a plurality of pixels arranged in a matrix, each pixel including a photoelectric conversion element for converting light into electric carriers, a transfer gate for transferring the electric carriers to a floating node, a first transistor for amplifying a signal based on a voltage of the floating node and for outputting the amplified signal to a column signal line, and a second transistor for resetting the voltage of the floating node; an analog front end (AFE) block; a flicker detection block; and a timing generator, the driving method comprising steps of:

reading out an image signal from the pixels in the matrix, during a frame period, by sequentially scrolling through, within the pixels in the matrix, a front curtain row, in which the photoelectric conversion elements and the floating nodes are reset, a flicker detection row, in which signals for detecting flickers are read out, and a rear curtain row, in which light signals in the photoelectric conversion elements are read out;

combining signals from the column signal lines based on the voltage of the floating node extending over regions of the plurality of pixels, during a period of maintaining the transfer gates at a non-conductive state, after resetting of the voltage of the floating nodes by the second transistors;

outputting a signal based on the combined signals from the column signal lines, for detecting a flicker of an imaging light source;

outputting as a pixel signal, column by column, a difference signal representing a difference between a signal of the column signal lines based on the electric carriers of the floating nodes transferred by the transfer gates, and a signal of the column signal lines based on a signal of the floating nodes after the reset by the second transistors; and outputting the pixel signal for each row of pixels, and the signal for detecting the flicker of the imaging light source for part of the rows of the pixels;

inputting, from a same path within the solid-state imaging apparatus in a time series, via the AFE block, the pixel signal and the signal for detecting the flicker of the imaging light source outputted from the solid-state imaging apparatus, and outputting, via the AFE block, to different paths, the pixel signal and the signal for detecting the flicker of the imaging light source;

outputting, via the flicker detection block, a determination value indicating an existence or an inexistence of the flicker of the imaging light source, based on the signal for detecting the flicker of the imaging light source outputted from the AFE block; and outputting, via the timing generator, a drive pulse of a flicker reducing drive mode or a normal drive mode according to the determination value.

6. A driving method of a solid-state imaging apparatus including a plurality of pixels arranged in a matrix, each pixel including a photoelectric conversion element for converting light into electric carriers, a transfer gate for transferring the electric carriers to a floating node, a first transistor for amplifying a signal based on a voltage of the floating node and for outputting the amplified signal to a respective column signal line, and a second transistor for resetting the voltage of the floating node, the driving method comprising steps of:

reading out an image signal from the pixels in the matrix, during a frame period, by sequentially scrolling through, within the pixels in the matrix, a front curtain row, in which the photoelectric conversion elements and the floating nodes are reset, a flicker detection row, in which signals for detecting flickers are read out, and a rear curtain row, in which light signals in the photoelectric conversion elements are read out;

combining signals from the column signal lines based on the voltage of the floating node extending over regions of the plurality of pixels, during a period of maintaining the transfer gates at a non-conductive state, after resetting of the voltage of the floating nodes by the second transistors; and outputting the combined signals during a first reading period for reading the signals based on the electric carriers and the signals after resetting of the voltage of the floating nodes by the second transistors, and during a second reading period different from the first reading period.

7. The driving method according to claim 6, further comprising a step of:

detecting, based on signals read out during the second reading period, a flicker.

8. A driving method of a solid-state imaging apparatus including a plurality of pixels arranged in a matrix, each pixel including a photoelectric conversion element for converting light into electric carriers, a transfer gate for transferring the electric carriers to a floating node, a first transistor for amplifying a signal based on a voltage of the floating node and for outputting the amplified signal to a respective column signal line, and a second transistor for resetting the voltage of the floating node, the driving method comprising steps of:

reading out an image signal from the pixels in the matrix, during a frame period, by sequentially scrolling through, within the pixels in the matrix, a front curtain row, in which the photoelectric conversion elements and the floating nodes are reset, a flicker detection row, in which signals for detecting flickers are read out, and a rear curtain row, in which light signals in the photoelectric conversion elements are read out;

combining signals from the column signal lines based on the voltage of the floating node extending over regions of the plurality of pixels, during a period of maintaining the transfer gates at a non-conductive state, after resetting of the voltage of the floating nodes by the second transistors; and detecting a flicker of an imaging light source based on the combined signals.

* * * * *